(12) United States Patent
Middleton et al.

(10) Patent No.: US 9,018,913 B2
(45) Date of Patent: Apr. 28, 2015

(54) SYSTEM FOR DETERMINING BATTERY IMPEDANCE

(75) Inventors: Justin Dale Middleton, Peoria, IL (US); Wellington Ying-Wei Kwok, Dunlap, IL (US)

(73) Assignee: Caterpillar Inc., Peoria, IL (US)

( * ) Notice: Subject to any disclaimer, the term of this patent is extended or adjusted under 35 U.S.C. 154(b) by 324 days.

(21) Appl. No.: 13/475,891

(22) Filed: May 18, 2012

(65) Prior Publication Data

US 2013/0307334 A1 Nov. 21, 2013

(51) Int. Cl.
*G01R 31/36* (2006.01)
*H02J 7/00* (2006.01)

(52) U.S. Cl.
CPC ........ *G01R 31/3624* (2013.01); *G01R 31/3662* (2013.01); *G01R 31/3679* (2013.01); *H02J 7/0077* (2013.01)

(58) Field of Classification Search
CPC .......................................................... H02J 7/00
USPC .......................................................... 320/134
See application file for complete search history.

(56) References Cited

U.S. PATENT DOCUMENTS

| | | |
|---|---|---|
| 5,193,067 A | 3/1993 | Sato et al. |
| 5,404,106 A | 4/1995 | Matsuda |
| 5,457,377 A | 10/1995 | Jonsson |
| 5,539,318 A | 7/1996 | Sasaki |
| 6,285,163 B1 | 9/2001 | Watanabe et al. |
| 6,300,763 B1 | 10/2001 | Kwok |
| 6,847,191 B1 | 1/2005 | Wang |
| 7,085,661 B2 | 8/2006 | Emori et al. |
| 7,324,902 B2 | 1/2008 | Verbrugge et al. |
| 7,358,704 B2 | 4/2008 | Yumoto et al. |

(Continued)

FOREIGN PATENT DOCUMENTS

| | | |
|---|---|---|
| JP | 06-347861 A | 12/1994 |
| JP | 2009241646 A | 10/2009 |

(Continued)

OTHER PUBLICATIONS

IEEE, "Analysis and Interpretation of AC-measurement on Batteries used to access State-of-Health and Capacity-condition," 1995, pp. 828-833.

(Continued)

*Primary Examiner* — Thuan Do
(74) *Attorney, Agent, or Firm* — Finnegan, Henderson, Farabow, Garrett & Dunner, LLP

(57) ABSTRACT

A method for real-time characterization of a battery includes providing electric power to one or more electrical power loads, charging and discharging the battery based on power needs of the one or more electrical power loads, and monitoring for a circumstance where charging and discharging of the battery results in terminal voltage of the battery substantially equaling open-circuit voltage of the battery and recording the measured terminal voltage as a first measured voltage. The method may also include monitoring for a subsequent circumstance subsequent when charging and discharging the battery results in battery current larger than a predetermined value and recording an existing terminal voltage as a second measured voltage. The method may also include using the first and second measured voltages to determine a measured internal impedance of the battery. These actions may be performed between startup and shutdown of the power system.

10 Claims, 7 Drawing Sheets

(56) References Cited

U.S. PATENT DOCUMENTS

| | | |
|---|---|---|
| 7,362,074 B2 | 4/2008 | Iwane et al. |
| 7,482,784 B2 | 1/2009 | Nagaoka |
| 7,554,296 B2 | 6/2009 | Mizuno et al. |
| 7,554,297 B2 | 6/2009 | Sada et al. |
| 7,560,882 B2 | 7/2009 | Clark et al. |
| 7,564,221 B2 | 7/2009 | Asai et al. |
| 7,567,085 B2 | 7/2009 | Kim et al. |
| 7,567,086 B2 | 7/2009 | Salman et al. |
| 7,583,053 B2 | 9/2009 | Kamohara |
| 7,612,532 B2 | 11/2009 | Verbrugge |
| 7,856,328 B2 | 12/2010 | Barsoukov et al. |
| 8,036,839 B2 | 10/2011 | Machiyama et al. |
| 8,791,669 B2 * | 7/2014 | Ghantous et al. ............ 320/139 |
| 2002/0175655 A1 | 11/2002 | Huykman et al. |
| 2004/0024546 A1 | 2/2004 | Richter |
| 2006/0066285 A1 | 3/2006 | Minamiura |
| 2006/0176022 A1 | 8/2006 | Namba |
| 2008/0054909 A1 | 3/2008 | Fukuda |
| 2008/0233469 A1 | 9/2008 | Drozdz et al. |
| 2009/0115419 A1 | 5/2009 | Ueda et al. |
| 2009/0182517 A1 | 7/2009 | Gandhi et al. |
| 2009/0237087 A1 | 9/2009 | Anbari |
| 2010/0036626 A1 | 2/2010 | Kang et al. |
| 2010/0052618 A1 | 3/2010 | Inoue et al. |
| 2011/0077879 A1 | 3/2011 | Paryani |
| 2011/0187329 A1 | 8/2011 | Majima et al. |
| 2012/0029851 A1 | 2/2012 | Nakayama et al. |

FOREIGN PATENT DOCUMENTS

| | | |
|---|---|---|
| JP | 2010-124629 A | 6/2010 |
| JP | 2010127880 A | 6/2010 |
| WO | WO2010029863 A1 | 3/2010 |

OTHER PUBLICATIONS

Idaho National Engineering & Environmental Laboratory, "FreedomCAR Battery Test Manual For Power-Assist Hybrid Electric Vehicles," Oct. 2003, 130 pages.

* cited by examiner

SYSTEM FOR DETERMINING BATTERY IMPEDANCE

TECHNICAL FIELD

The present disclosure relates generally to estimations of health for batteries and, more particularly, to estimations of a state of health for hybrid power system batteries.

BACKGROUND

The internal impedance of a battery may vary during use. As a battery ages and experiences charging and discharging cycles, the battery may physically and/or chemically change in ways that increase the internal impedance of the battery, thereby degrading the battery, or diminishing its state of health. Eventually, the internal impedance may increase to a point where the battery has reached the end of its useful life.

Additionally, for any given state of health of the battery, the internal impedance may vary depending on various aspects of the circumstances in which it operates. For example, the temperature of the battery, the state of charge of the battery (i.e., how much electrical energy the battery has stored), the magnitude of electric current being discharged from or supplied to the battery, and whether the battery is charging or discharging may all affect the internal impedance.

Having an accurate real-time estimate of the internal impedance of a battery may prove useful for a number of reasons. The internal impedance of a battery affects the maximum amount of current the battery can discharge and the maximum amount of charging current the battery can receive without driving the voltage at the battery's terminals below a minimum acceptable level or above a maximum acceptable level. The greater the internal impedance, the less discharging or charging current the battery can tolerate. Accordingly, the amount of power that a system can draw from the battery and the rate at which the system can recharge the battery may vary depending on the present internal impedance of the battery. Thus, having an accurate estimate of the present internal impedance of the battery may facilitate effectively and efficiently controlling the discharging and charging of the battery, as well as controlling other aspects of the operation of the power system to meet varying power needs. Furthermore, the internal impedance of the battery may serve as a reflection of a state of health, or degree of degradation, of the battery.

The "FreedomCAR" manual published in October 2003 by the Idaho National Engineering & Environmental Laboratory discloses procedures for estimating the internal resistance of a battery. For example, the FreedomCAR manual discusses a hybrid pulse power characterization test ("the HPPC test"). The HPPC test disclosed by the FreedomCAR manual involves identifying the voltage and current of a battery at various points in a discharging and charging cycle and estimating the internal resistance based on the identified values. The charging and discharging cycle involves discharging the battery at a constant current for a 10 second discharging period, refraining from charging or discharging the battery for a 60 second rest period, and then charging the battery at a constant current for a 10 second regeneration period. Battery voltage is measured at the beginning of the discharging period, at the end of the discharging period, at the end of the rest period, and at the end of the regeneration period. Subsequently, these voltages and the known magnitudes of the charging and discharging currents are used to calculate estimated values of the internal resistance of the battery during the discharging period and the charging period.

Other publications also discuss methods for estimating the internal impedance of a battery. For example, Published U.S. Patent Application No. 2007/0145953 to Asai et al. ("the '953 application") also discusses methods for estimating the internal impedance of a battery. The methods disclosed by the '953 application take battery temperature and battery degradation into consideration when estimating the battery's internal impedance. Similarly, Published U.S. Patent Application 2007/0013347 to Kamohara ("the '347 application") discusses methods of estimating internal impedance of a battery. The '347 application discloses that its methods include correcting an estimated internal impedance of a battery based on a sensed temperature of the battery and a map of a relationship between internal impedance and battery temperature.

Published U.S. Patent Application No. 2011/0077879 to Paryani ("the '879 application") employs many of the teachings of the FreedomCAR manual, the '953 application, and the '347 application to estimate internal impedance of a battery. The '879 application discloses periodically testing the impedance of the battery when the battery is not needed to provide power to loads. Specifically, the '879 application suggests that the impedance testing is performed when the battery is being charged at night. The process includes charging the battery to a predefined state of charge (e.g., 60% SOC), refraining from charging or discharging the battery for a relaxation period, and then resuming full-current charging for a period. Battery voltages are identified at the end of the relaxation period and at the end of the final charging period. Similar to the procedure disclosed in the FreedomCAR Manual, the procedure disclosed in the '879 application uses the known magnitude of electric current during the final charging period in combination with the measured voltages at the end of the relaxation period and the final charging period to calculate an impedance of the battery. The '879 application suggests using this measured impedance value of the battery to determine an impedance degradation factor representative of a change in the battery's impedance due to degradation of its state of health.

Just as the prior '953 application discloses taking battery temperature and battery degradation into account when estimating battery impedance, the '879 application indicates that, after its system determines the battery impedance in a controlled charging situation at night, it may subsequently estimate internal impedance during use in a manner that accounts for battery temperature and battery degradation. To do so, the '879 application discloses multiplying the impedance degradation factor determined during the testing procedure by a reference impedance. Similar to the disclosure in the '347 application of using a map to correct impedance based on battery temperature, the '879 application suggests using a look-up table responsive to state of charge and battery temperature to establish the reference impedance.

Although the '879 application discloses a method for measuring internal impedance when the power system is inactive at night and subsequently estimating internal impedance based on battery degradation, battery temperature, and state of charge, certain disadvantages may persist. For example, the '879 application's reliance on impedance measurement when the power system is inactive may have drawbacks. Limiting impedance measurement to situations when the power system is inactive may result in undesirably infrequent impedance measurements and/or impinge on an operator's ability to freely use the power system as desired.

The system and methods of the present disclosure may solve one or more of the problems set forth above.

SUMMARY

One disclosed embodiment relates to a method for real-time characterization of a battery in a power system. The method may include providing electric power to one or more electrical power loads of the power system. The method may also include charging and discharging the battery based on power needs of the one or more electrical power loads. Additionally, the method may include monitoring with at least one information-processing device for a circumstance where charging and discharging of the battery based on the power needs of the one or more electrical power loads results in terminal voltage of the battery substantially equaling open-circuit voltage of the battery and recording the measured terminal voltage as a first measured voltage. The method may also include monitoring for a circumstance subsequent to the terminal voltage substantially equaling the open-circuit voltage when charging and discharging the battery based on the power needs of the electrical power loads results in battery current larger than a predetermined value and recording an existing terminal voltage as a second measured voltage with the at least one information-processing device. The method may also include using the first and second measured voltages to determine a measured internal impedance of the battery with the at least one information-processing device. These actions may be performed between startup and shutdown of the power system.

Another embodiment relates to a power system. The power system may include a battery, one or more electrical power loads, and power-system controls. The power-system controls may be configured to coordinate operation of the power system. The power-system controls may be configured to control supply of electric power to the electrical power loads. Additionally, the power-system controls may be configured to control charging and discharging of the battery based on needs of the one or more electrical power loads. The power-system controls may also be configured to monitor for a circumstance where the charging and discharging of the battery based on the power needs of the one or more electrical power loads results in battery current remaining smaller than a reference value for a reference period, and when this circumstance occurs, recording a terminal voltage of the battery as a first measured voltage. The power-system controls may be further configured to monitor for a circumstance subsequent to the terminal voltage substantially equaling the open-circuit voltage when charging and discharging the battery based on the power needs of the electrical power loads results in battery current larger than a predetermined value and record an existing terminal voltage as a second measured voltage. Additionally, the power-system controls may be configured to use the first and second measured voltages to determine a measured internal impedance of the battery. The power-system controls may be configured to perform these tasks between startup and shutdown of the power system.

A further disclosed embodiment relates to a method of operating a power system with a battery. The method may include estimating an internal impedance of the battery with at least one information-processing device. The method may also include determining with the at least one information-processing device a first current magnitude based on voltage limits for the battery and the estimated internal impedance. Additionally, the method may include comparing with the at least one information-processing device the first current magnitude and a second current magnitude to determine which of the first and second current magnitudes is smaller, the second current magnitude being a limit for a magnitude of current for at least one component of the power system. The method may further include calculating with the at least one information processing device a charging or discharging power limit for the battery based on whichever of the first and second current magnitudess is smaller.

DETAILED DESCRIPTION

Figure 1A:
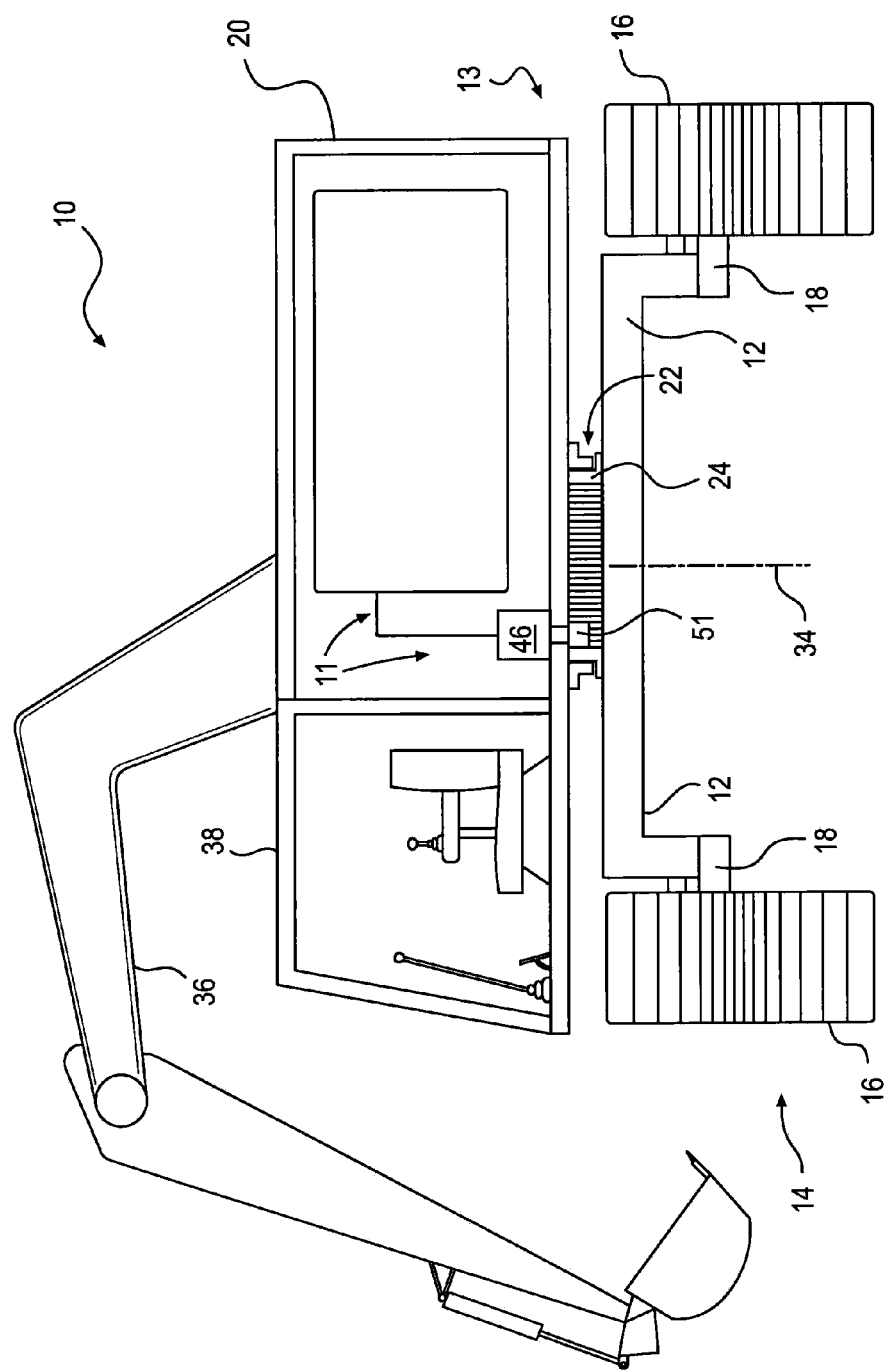
FIG. 1A illustrates one embodiment of a machine according to the present disclosure.
Figure 1B:
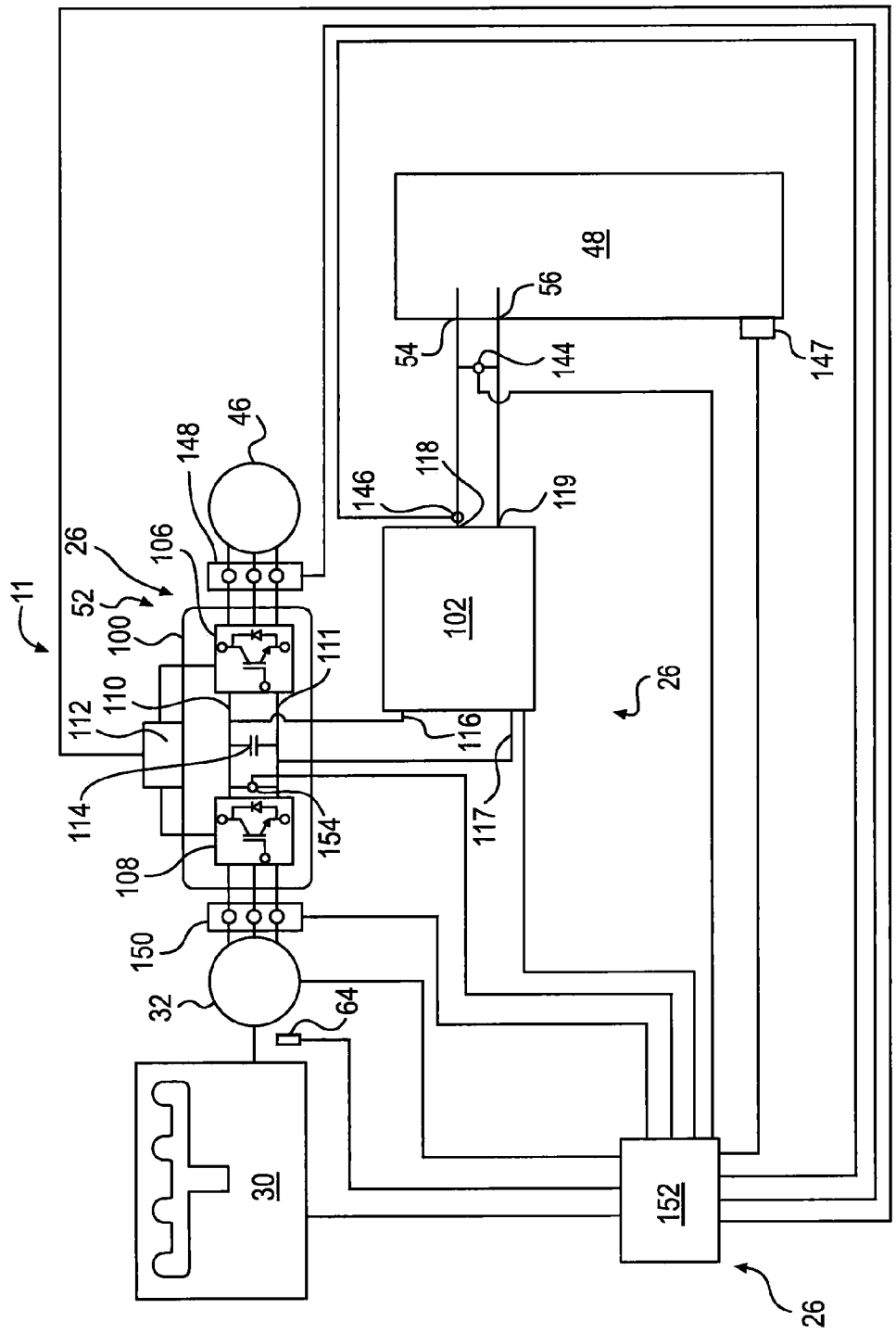
FIG. 1B illustrates one embodiment of a power system according to the present disclosure.

FIGS. 1A and 1B show a machine 10, a power system 11, and various components thereof according to the present disclosure. Machine 10 may be any type of machine that employs power to perform one or more tasks. For example, machine 10 may be a mobile machine configured to transport or move people, goods, or other matter or objects. Additionally, or alternatively, machine 10 may be configured to perform a variety of other operations associated with a commercial or industrial pursuit, such as mining, construction, energy exploration and/or generation, manufacturing, transportation, and agriculture.

As shown in FIG. 1A, in some embodiments, machine 10 may be an excavator configured for digging. Machine 10 may include a chassis 13 to which other components of machine 10 are attached. In the example shown in FIG. 1, chassis 13 may include an undercarriage 14 and a superstructure 20. Undercarriage 14 may include a frame 12. In some embodiments, machine 10 may be a mobile machine, and undercarriage 14 may include one or more propulsion devices 16 for propelling machine 10. Propulsion devices 16 may be any type of device configured to propel machine 10. For example, as FIG. 1 shows, propulsion devices 16 may be track units. Alternatively, propulsion devices 16 may be wheels or other types of devices operable to propel machine 10. Undercarriage 14 may also include one or more components for driving propulsion devices 16. For example, undercarriage 14 may include drive motors 18 for driving propulsion devices 16. Drive motors 18 may be electric motors or hydraulic motors.

Superstructure 20 may be suspended from frame 12. In some embodiments superstructure 20 may be suspended from frame 12 by a pivot system 22. Pivot system 22 may include a swing bearing 24 and an electric motor 46. Swing bearing 24 may include an inner race mounted to frame 12 and an outer race to which superstructure 20 mounts. Both the inner and outer races of swing bearing 24 may extend concentric to a vertical axis 34. The inner and outer races may be engaged to one another via rolling elements (not shown), such as ball bearings, in such a manner that the outer race and superstructure 20 may pivot around axis 34 relative to frame 12.

Electric motor 46 may be operable to rotate superstructure 20 and the outer race of swing bearing 24 around axis 34. Electric motor 46 may have a gear 51 mounted to its output shaft, and electric motor 46 may mount to superstructure 20 in a position such that gear 51 meshes with gear teeth on frame 12. Electric motor 46 may receive power to rotate superstructure 20 around axis 34 from various components of power system 11. Electric motor 46 may constitute one of many electrical power loads of power system 11.

Machine 10 may include various other components. For example, as FIG. 1A shows, machine 10 may include an implement 36. Implement 36 may be mounted to various parts of machine 10 and configured to perform various tasks. In some embodiments, implement 36 may be mounted to superstructure 20 and configured to perform digging. Machine 10 may also include an operator station 38 from which an individual can control one or more aspects of the operation of machine 10. Operator station 38 may also be mounted to superstructure 20.

FIG. 1B shows power system 11 in greater detail. Power system 11 may include power-system controls 26 and various components operable to provide power to perform various tasks. In some embodiments, power system 11 may be a hybrid-electric power system. In addition to power-system controls 26, power system 11 may include electric motor 46, a prime mover 30, an electric motor/generator 32, a battery 48, and a power-transmission system 52. As used herein, the term "electric motor/generator" refers to any electrical device operable to operate as an electric motor when receiving electrical power and/or to operate as an electric generator when being mechanically driven.

Prime mover 30 may be any type of device configured to produce mechanical power to drive electric motor/generator 32. For example, prime mover 30 may be a diesel engine, a gasoline engine, a gaseous fuel-powered engine, or any other type of component operable to produce mechanical power.

Electric motor/generator 32 may be any type of component operable to generate electricity with mechanical power received from prime mover 30. Electric motor/generator 32 may also be operable to receive electricity and operate as an electric motor to drive prime mover 30 for a number of purposes. Electric motor 46 may be any type of component operable to receive electricity from power-transmission system 52 and operate as an electric motor. Each of electric motor/generator 32 and electric motor 46 may be, for example, any of a permanent-magnet electric machine, a switched reluctance electric machine, a DC electric machine, an induction-type machine or any other type of electric machine known in the art.

Battery 48 may be any type of device operable to record electrical energy and exchange electricity with (i.e., receive electricity from and deliver electricity to) power-transmission system 52. Battery 48 may include a positive terminal 54 and a negative terminal 56.

Power-transmission system 52 may include an inverter 100, a power regulator 102, and various electrical connectors, such as electric lines and/or electric switches connecting these devices. Inverter may 100 include a power electronics unit 106, a power electronics unit 108, power lines 110, 111, a bulk capacitor 114, and a controller 112. Power electronics unit 106 may be operable to regulate a flow of power between electric motor 46 and power lines 110, 111. Power electronics module 106 may also be operable to convert the form of electricity flowing between electric motor 46 and power lines 110, 111. For example, power electronics unit 106 may be operable to convert between alternating electric current at electric motor 46 and direct current at power lines 110, 111. Power electronics module 108 may similarly be operable to regulate a flow of power between electric motor/generator 32 and power lines 110, 111. Power electronics module 108 may also be able to convert the form of electricity flowing between electric motor/generator 32 and power lines 110, 111, such as converting between alternating current electricity at electric motor/generator 32 and direct current electricity at power lines 110, 111. Power electronics modules 106-108 may include various types of controllable electric components for regulating and/or converting electrical power, including, but not limited to SCRs (sillicon controller rectifiers), GTOs (gate turn-offs), IGBTs (insulated gate bipolar transistors), and FETs (field-effect transistors). Bulk capacitor 114 may be connected between power lines 110, 111 and serve to smooth out any fluctuations in voltage across power lines 110, 111. This configuration of inverter 100 may allow exchange of electricity between electric motor/generator 32 and electric motor 46 via power electronics modules 106, 108 and power lines 110, 111.

Controller 112 may be operatively connected to power electronics modules 106, 108, and controller 112 may be configured (e.g., programmed) to control one or more aspects of the operation of power electronics modules 106, 108. In some embodiments, controller 112 may include, for example, one or more microprocessors and/or one or more memory devices. By controlling power electronics modules 106, 108, controller 112 may be operable to control the voltage on power lines 110, 111, as well as the magnitude of current flowing between power lines 110, 111, electric motor 46, and electric motor/generator 32.

Power regulator 102 may include input/output terminals 116, 117, 118, 119. Power regulator 102 may have any configuration that allows it to regulate one or more aspects of electricity exchanged between terminals 116, 117 and terminals 118, 119. Power regulator 102 may, for example, be operable to control whether electricity is exchanged between terminals 116, 117 and terminals 118, 119. Power regulator 102 may also be configured to control which direction electricity flows between terminals 116, 117 and terminals 118, 119, i.e., whether electricity flows from terminals 116, 117 to terminals 118, 119, or vice-a-versa. Power regulator 102 may exchange electricity in various forms. In some embodiments, power regulator 102 may be configured to receive and/or supply direct current electricity at terminals 116, 117, 118, 119. Power regulator 102 may also be operable to control the voltage at each of terminals 116, 117, 118, 119 as well as the magnitude of electric current flowing at each of terminals 116, 117, 118, 119. For example, power regulator 102 may be operable to change the electricity transmitted between terminals 116, 117 and terminals 118, 119 from one voltage (such as approximately 650 volts) of direct current electricity at terminals 116, 117 to another voltage (such as approximately 350 volts) of direct current electricity at terminals 118, 119. As discussed further below, power regulator 102 may be controllable by one or more other component(s) of power system 11, so that those other components may control how power regulator 102 controls the exchange of electricity between terminals 116, 117 and terminals 118, 119. Power regulator 102 may include any suitable configuration of components that allows it to provide the above-discussed functionality.

Inverter 100, power regulator 102, battery 48, electric motor 46, and electric motor/generator 32 may be electrically connected to one another in various ways. As FIG. 1B shows, in some embodiments, terminals 116, 117 of power regulator 102 may be electrically connected to power lines 110, 111 of inverter 100. This may allow exchange of electricity between power regulator 102, electric motor 46, and electric motor/generator 32 via power lines 110, 111 of inverter 100. Additionally, power-transmission system 52 may have provisions connecting terminals 118, 119 of power regulator 102 directly or indirectly to battery 48. For example, terminals 118, 119 of power regulator 102 may, for example, be continuously electrically connected to terminals 54 and 56 of battery 48.

The exemplary configuration of power-transmission system 52 shown in FIG. 1B may allow it to transmit electricity between electric motor/generator 32, electric motor 46, and battery 48 in various ways through inverter 100 and power regulator 102. For example, power-transmission system 52 may transmit electricity from electric motor/generator 32, through inverter 46, to electric motor 46, thereby operating electric motor 46 to rotate superstructure 20. Additionally or alternatively, power-transmission system 52 may at times transmit electricity from battery 48, through power regulator 102, to inverter 100, to electric motor 46 to rotate superstructure 20. At other times, power-transmission system 52 may charge battery 48 by transmitting electricity from inverter 100 (e.g. electricity generated by electric motor/generator 32) through power regulator 102, to battery 48.

In addition to those electrical loads and sources shown in FIG. 1B, power system 11 may also include a number of other electrical loads and/or sources. For example, in addition to electric motor 46, power system 11 may include various other large, high-voltage electrical loads, such as drive motors 18, connected to power lines 110, 111 of inverter 100. Additionally, power system 11 may have various smaller, low-voltage loads, such as lights, gauges, sensors, fan motors, and the like.

Power-system controls 26 may be configured to control charging and discharging of battery 48, operation of prime mover 30, operation of electric motor/generator 32, operation of electric motor 46, and transmission of electricity through power-transmission system 52 in connection with all of these tasks. Power-system controls 26 may include inverter 100 and power regulator 102. To control the operation of these components, some embodiments of power-system controls 26 may also include one or more other components. For example, as FIG. 1B shows, power-system controls 26 may include a controller 152 operably connected to controller 112 of inverter 100 and to power regulator 102. Controller 152 may also be operatively connected to prime mover 30, electric motor/generator 32, and electric motor 46 in a manner allowing controller 152 to monitor and/or control one or more aspects of the operation of these components. Based on various operating parameters of prime mover 30, electric motor/generator 32, electric motor 46, and/or other components of power system 11, controller 152 may perform high-level control of power system 11. Controller 152 may include any suitable information processing device for controlling the components discussed above. In some embodiments, controller 152 may include one or more microprocessors and/or one or more memory devices programmed to operate in the manners discussed below.

Power-system controls 26 may also include components for monitoring various aspects of the operation of power system 11. For example, power-system controls 26 may include provisions for monitoring the magnitude of electricity exchanged between battery 48 and power-transmission system 52. For instance, in the embodiment shown in FIG. 1B, power-system controls 26 may include a current sensor 146 for sensing a magnitude of electric current exchanged between battery 48 and power-transmission system 52. Current sensor 146 may also sense the direction or sign of the battery current, i.e., whether the electric current is flowing to battery 48 from power-transmission system 52 or vice-a-versa. Current sensor 146 may be directly or indirectly operably connected to controller 152 to allow controller 152 to monitor the magnitude and direction of electric current being exchanged between battery 48 and power-transmission system 52. Power-system controls 26 may also include a voltage sensor 144 for sensing a voltage across terminals 54, 56 of battery 48. Like current sensor 146, voltage sensor 144 may be directly or indirectly operably connected to controller 152 to allow controller 152 to monitor the terminal voltage of battery 48. Additionally, power-system controls 26 may include a temperature sensor 147 configured to generate a signal indicative of the temperature of battery 48 and transmit that information to controller 152.

Machine 10 and power system 11 are not limited to the configurations shown in FIGS. 1A and 1B and discussed above. For example, power-system controls 26 may include various other configurations and/or arrangements for controlling the transmission of electricity between the various components of power system 11. Such other configurations of power-system controls 26 may include additional control components communicatively linked to one another and operable to share control tasks, such as other controllers, in addition to controller 152. Additionally, power-system controls 26 may include other numbers and/or configurations of power regulators, electrical connectors, and other components that transmit power between the power loads and power sources of power system 11. Power system 11 may also include other batteries, in addition to battery 48. Additionally, electric motor 46 may serve a function other than rotating superstructure 20 around axis 34, such as moving other components of machine 10 or supplying mechanical power to propel machine 10. Furthermore, machine 10 may be any of a number of types of machines other than an excavator, including a stationary machine.

INDUSTRIAL APPLICABILITY

Machine 10 and power system 11 may have use in any application requiring power to perform one or more tasks. During operation of machine 10, power-system controls 26 may activate various electric loads to perform various tasks, such as activating electric motor 46 to rotate superstructure 20 around axis 34. Power system 11 may provide the electricity required to operate electric motor 46 and any other electric loads from various sources in various situations. Depending on the circumstances, power system 11 may provide electricity to electric motor 46 and the other electric loads from one or both of electric motor/generator 32 and battery 48. When the electrical needs of electric motor 46 and other electrical loads of power system 11 are high, power-system controls 26 may operate power-transmission system 52 to supply electricity from battery 48 to one or more of the electrical loads of power system 11. At other times, power-system controls 26 may control power-transmission system 52 to supply electricity to battery 48 to recharge it.

It may prove valuable during operation of power system 11 to have an accurate, real-time estimate of how much electric current and power the system can withdraw from or supply to battery 48, as well as how much aggregate energy battery 48 can supply or receive at any given point. Having accurate estimates of these parameters may allow planning effective strategies for charging and discharging battery 48 as part of an efficient strategy for meeting the power needs of power system 11 and machine 10. The following control strategies may be implemented by power-system controls 26 to provide accurate real-time estimates of these valuable pieces of information.

Figure 2:
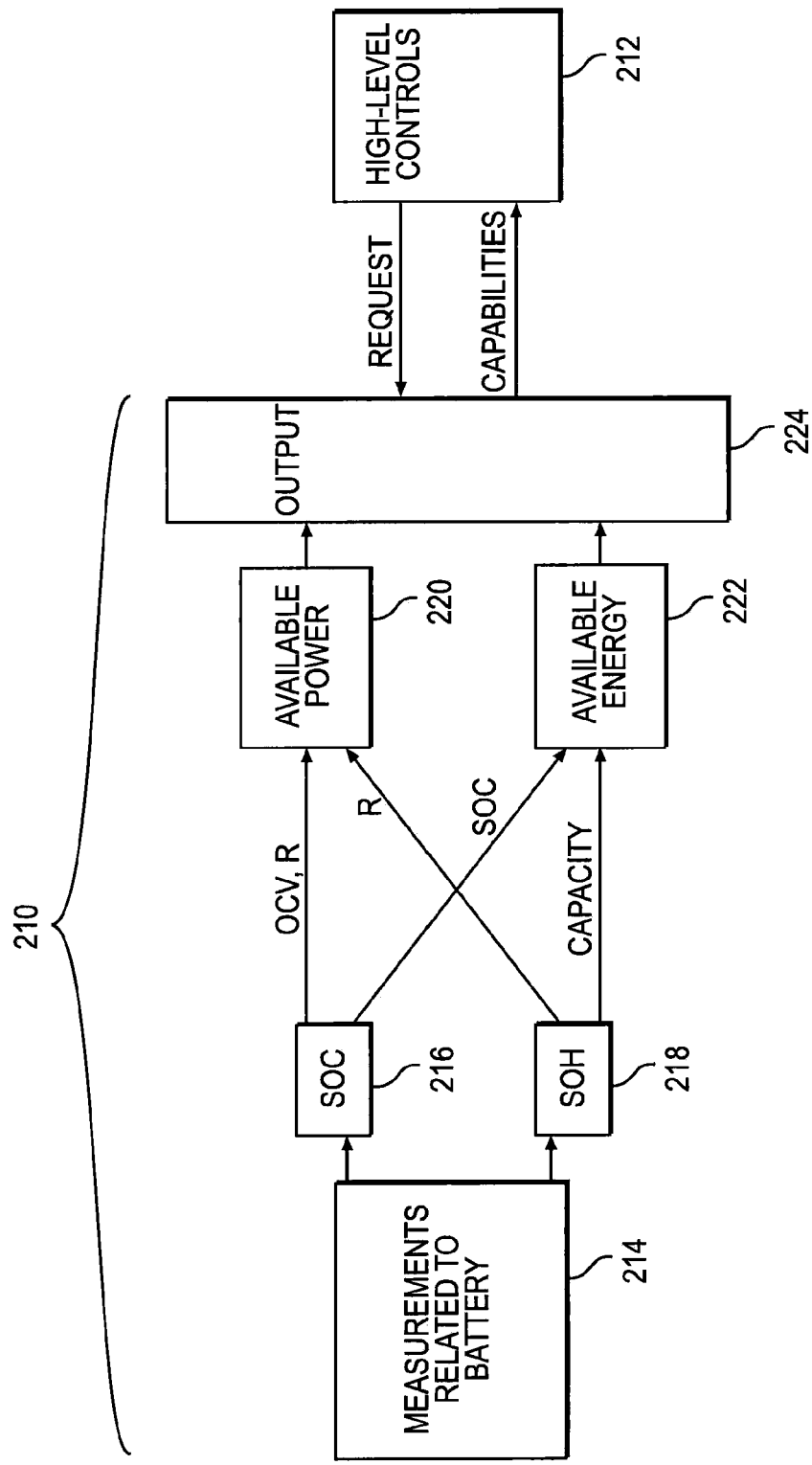
FIG. 2 illustrates a block diagram of a control architecture according to one embodiment of the present disclosure.

FIG. 2 provides a block diagram of one control architecture that power-system controls 26 may implement. In this example, power-system controls 26 may include a battery-monitoring section 210 and a high-level controls section 212. High-level controls section 212 may perform overall control of the operation of power system 11, including planning charging and discharging of battery 48. As part of doing so, high-level controls section 212 may request information from battery-monitoring section 210 regarding the present capabilities of battery 48. For example, high-level controls section 212 may request information regarding the magnitude of electric current and/or power that can presently be transmitted to or from battery 48, as well as the aggregate amount of energy that can presently be transmitted to or from battery 48. Battery-monitoring section 210 may provide such information regarding the present capabilities of battery 48 to high-level controls section 212 upon request.

Battery-monitoring section 210 may include various control blocks that enable it to evaluate the present capabilities of battery 48. For example, battery-monitoring section 210 may include a monitoring block 214, an SOC block 216, an SOH block 218, an available power block 220, an available energy block 222, and an output block 224. Monitoring block 214 may receive measurements related battery 48. In some embodiments, monitoring block 214 may receive a terminal voltage of battery 48 via the signal from voltage sensor 144, a magnitude and direction of electric current flowing to or from battery 48 via the signal from current sensor 146, and a temperature of battery 48 via the signal from temperature sensor 147.

SOC block 216 may receive information from monitoring block 214 and determine a state of charge of battery 48. The state of charge of battery 48 may be a value indicative of the amount of electrical energy presently stored in battery 48. The state of charge may be expressed in various ways, including as an absolute value or as a relative value. In some embodiments, the state of charge value may be the amount of presently stored energy expressed as a percentage of the theoretical full energy-storage capacity of battery 48. In such embodiments, if the amount of energy presently stored in battery 48 is, for example, half of the theoretical full energy-storage capacity of battery 48, the state of charge may be 50%.

SOC block 216 may determine the state of charge of battery 48 in various manners. In some embodiments, SOC block 216 may integrate the amount of electric current discharged from and supplied to battery 48 in order to keep track of the amount of electrical energy stored in battery 48. Additionally or alternatively, SOC block 216 may use the terminal voltage of the battery 48, the temperature of battery 48, and/or other monitored parameters in the process of estimating the state of charge.

SOC block 216 may also estimate an open-circuit voltage of battery 48. The open-circuit voltage of battery 48 is voltage that battery 48 would have at its terminals 54, 56 when it is not receiving or discharging electricity and has not been receiving or discharging electricity for some time, i.e., when battery 48 is in a relaxed state. As discussed in greater detail below, when battery 48 is in a relaxed state, SOC block 216 may simply identify the presently sensed terminal voltage as the open-circuit voltage. Between times when battery 48 is in a relaxed state, SOC block 216 may use various approaches to estimate the open-circuit voltage of battery 48. In some embodiments, SOC block 216 may include one or more tables and/or equations that define relationships between the open-circuit voltage and other operating parameters, such as the present terminal voltage, the present magnitude and direction of current flow to or from battery 48, and the present temperature of battery 48. In such embodiments, SOC block 216 may use such tables and/or equations in combination with sensed values of various parameters to estimate the open-circuit voltage at any time.

SOH block 218 may determine one or more values indicative of the state of health of battery 48. The one or more values determined by SOH block 218 may provide an indication of how much the capabilities of battery 48 have degraded because of time and power cycles. A state of health value for battery 48 may be expressed in various ways. In some embodiments, one state of health value that SOH block 218 may generate is a percentage value representing what percent of the useful life of battery 48 remains. Another exemplary value that SOH block 218 may generate is an estimate of how much energy can be transmitted to and from battery 48 before it reaches the end of its useful life.

SOH block 218 may employ various approaches for generating one or more values representative of the state of health of battery 48. In some embodiments, SOH block 218 may include one or more tables and/or equations that define a relationship between a state of health value and one or more other measured and/or estimated values related to battery 48. For example, SOH block 218 may include one or more tables or equations that define a relationship between a state of health value, the internal impedance of battery 48, the temperature of battery 48, the terminal voltage of battery 48, and the magnitude and direction of electric current flowing to or from battery 48. Using such tables and/or equations in combination with estimated or measured values of the internal impedance, the temperature, the terminal voltage, and the current direction and magnitude, SOH block 218 may generate a value indicative of the state of health of battery 48. SOH block 218 may receive signals indicative of the temperature, terminal voltage, and the current from monitoring block 214. SOH block 218 may perform real-time estimation of the internal impedance of battery 48 using methods discussed in greater detail below.

SOH block 218 may also determine a capacity of battery 48, which may be the maximum amount of electrical energy that battery 48 can store. As battery 48 degrades, its capacity may decrease. Accordingly, SOH block 218 may determine the capacity based at least in part on the value or values it determines for the state of health of battery 48. SOH block 218 may use various approaches to do so. In some embodiments, SOH block 218 may use one or more tables and/or equations that define relationships between the capacity of battery 48, the state of health of battery 48, and the temperature of battery 48.

Available power block 220 may receive inputs from SOC block 216 and SOH block 218 and calculate limits for the magnitude of electric current and power that should be supplied to and/or discharged from battery 48. The inputs to available power block 220 may include the open-circuit voltage and one or more internal impedance values for battery 48, such as an internal impedance value for discharging and an internal impedance value for charging. Available power block 220 may use these and/or other inputs to calculate how much electric current and electric power battery 48 can receive and/or discharge while keeping the terminal voltage of battery 48 within a desired operating range. Additionally, available power block 220 may identify limits on the charging or discharging current and power based on other considerations. In some embodiments, such other considerations may include how much electric current other components of power system 11 are designed to carry. In some circumstances, battery 48 may be able to receive or discharge a magnitude of electric current greater than the design capacity of one or more components connected to battery 48. To account for this, available power block 220 may separately consider how much charging and/or discharging current is acceptable based on the current-carrying limitations of components of power system 11 other than battery 48. Methods that available power block 220 may use to identify electric current and power limits are discussed in greater detail below.

Available energy block 222 may receive various inputs and calculate how much electrical energy battery 48 can receive or discharge without becoming overcharged or excessively discharged. The inputs that available energy block 222 uses to perform these calculations may include the state of charge and the capacity of battery 48. Available energy block 222 may use various means to calculate the amount of energy battery 48 can receive and/or discharge. In some embodiments, available energy block 222 may include one or more tables and/or equations that define relationships between the capacity of battery 48, the state-of-charge of battery 48, and the amount of electrical energy that battery 48 can receive or discharge. Such tables and/or equations may also factor in the values of one or more other parameters, such as the temperature of battery 48, the present terminal voltage of battery 48, and/or the present magnitude of electric current being received by or discharged from battery 48.

Output block 224 may serve as an interface between battery-monitoring section 210 and high-level controls 212. Output block 224 may receive requests for information from high-level controls 212 and transmit the requested information to high-level controls 212. For example, output block 224 may communicate to high-level controls 212 values including, but not limited to, the magnitude(s) of electric current and/or power that battery 48 can receive and/or discharge, the amount of electrical energy that battery 48 can receive and/or discharge, the state of charge of battery 48, and/or the state of health of battery 48.

Figure 3A:
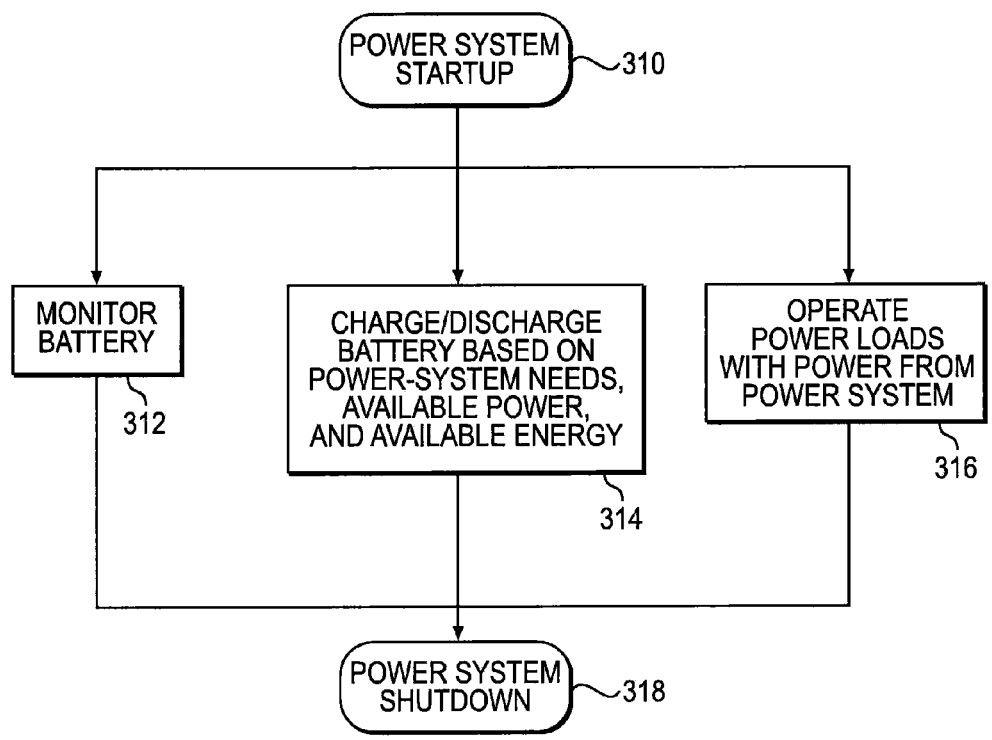
FIG. 3A illustrates a flow chart for one embodiment of a control process according to the present disclosure.

Power-system controls 26 may use various processes for implementing the control architecture illustrated in FIG. 2. In some embodiments, power-system controls 26 may use the processes illustrated in the flow charts of FIGS. 3A-3D. FIG. 3A illustrates the general process that high-level controls 212 and battery-monitoring section 210 may implement, and FIGS. 3B-3D illustrate certain aspects of the processes in more detail.

As shown in FIG. 3A, the control algorithm may begin when power system startup occurs (step 310) and end when power system shutdown occurs (step 318). Power system startup and shutdown may be triggered in various ways. In some embodiments, power system startup may occur when an operator of machine 10 commands an "on" operating state of machine 10, such as by manipulating a key switch (not shown) to an "on" position. Similarly, power system shutdown may occur when an operator commands machine 10 to an "off" operating state, such as by manipulating a key switch (not shown) to an "off" position. Additionally, startup and shutdown of power system 11 may be triggered automatically by power-system controls 26 in response to various inputs. In some embodiments, power-system startup may involve starting of prime mover 30, and power-system shutdown may involve shutting down prime mover 30. Additionally, in some embodiments, each of the processes discussed below may be executed after prime mover 30 is started and before prime mover 30 is shut down.

Between power system startup and shutdown, power-system controls 26 may simultaneous perform a number of tasks in parallel. One such task may be monitoring battery 48 (step 312). This may involve implementing the control blocks of battery-monitoring section 210 shown in FIG. 2. Simultaneously and based at least in part on the results of the battery-monitoring processes, power-system controls 26 may charge and discharge battery 48 (step 314), as well as operate power loads, such as electric motor 46, with power from power system 11 (step 316). When charging and discharging battery 48 (step 314), power-system controls 26 may determine whether to charge or discharge battery 48 and what magnitude of charging or discharging current to implement based on the needs of power system 11 in combination with the present capabilities of battery 48, including the magnitude of charging and/or discharging current that battery 48 can accept and the amount of energy battery 48 can accept and/or discharge. Power-system controls 26 may operate the power loads based on commands from an operator. For example, power-system controls 26 may operate electric motor 46 when an operator commands rotation of superstructure 20. Additionally or alternatively, power-system controls 26 may operate one or more power loads automatically.

Figure 3B:
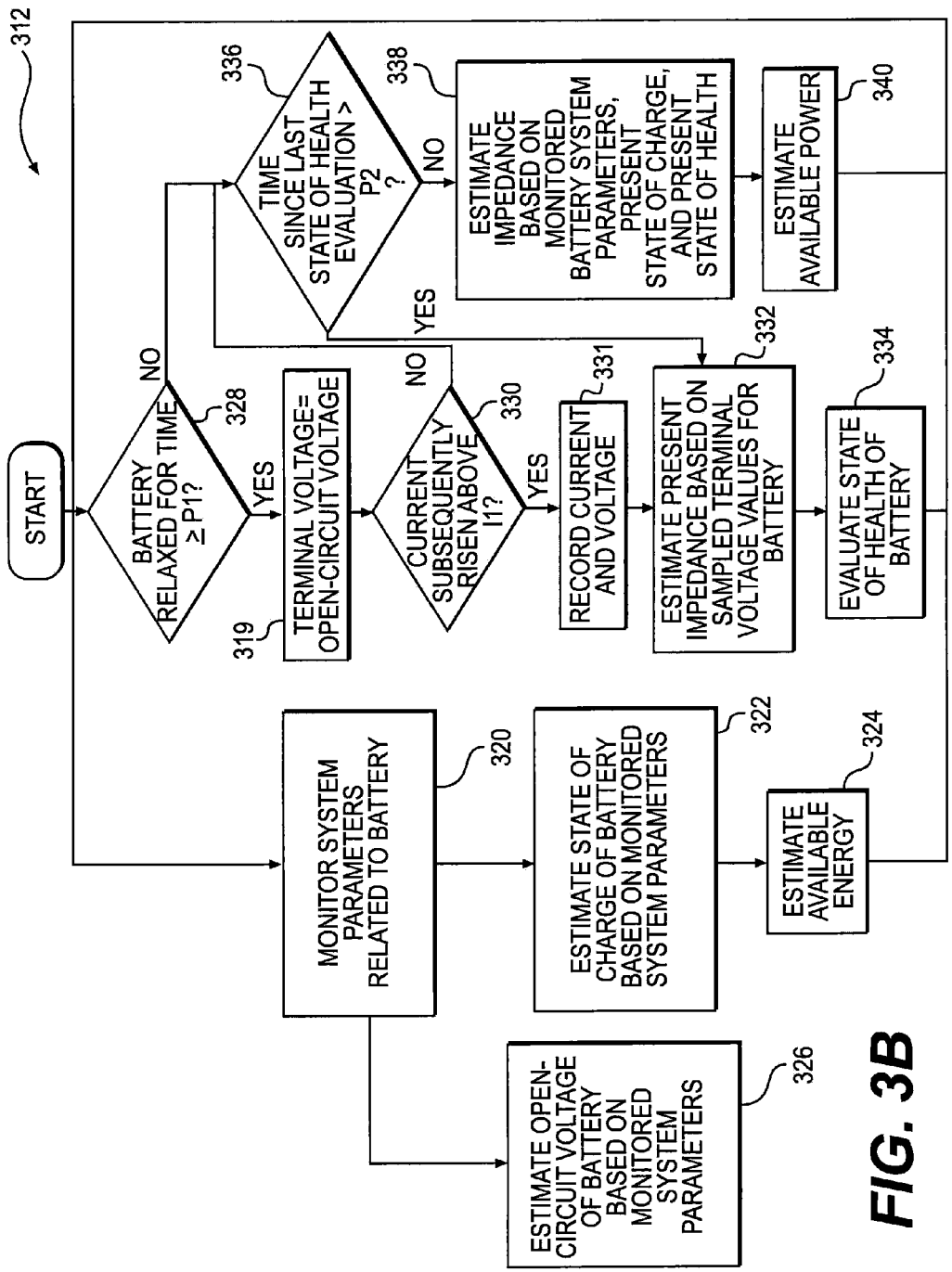
FIG. 3B illustrates a flow chart that outlines a portion of the flow chart of FIG. 3A in greater detail.
Figure 3C:
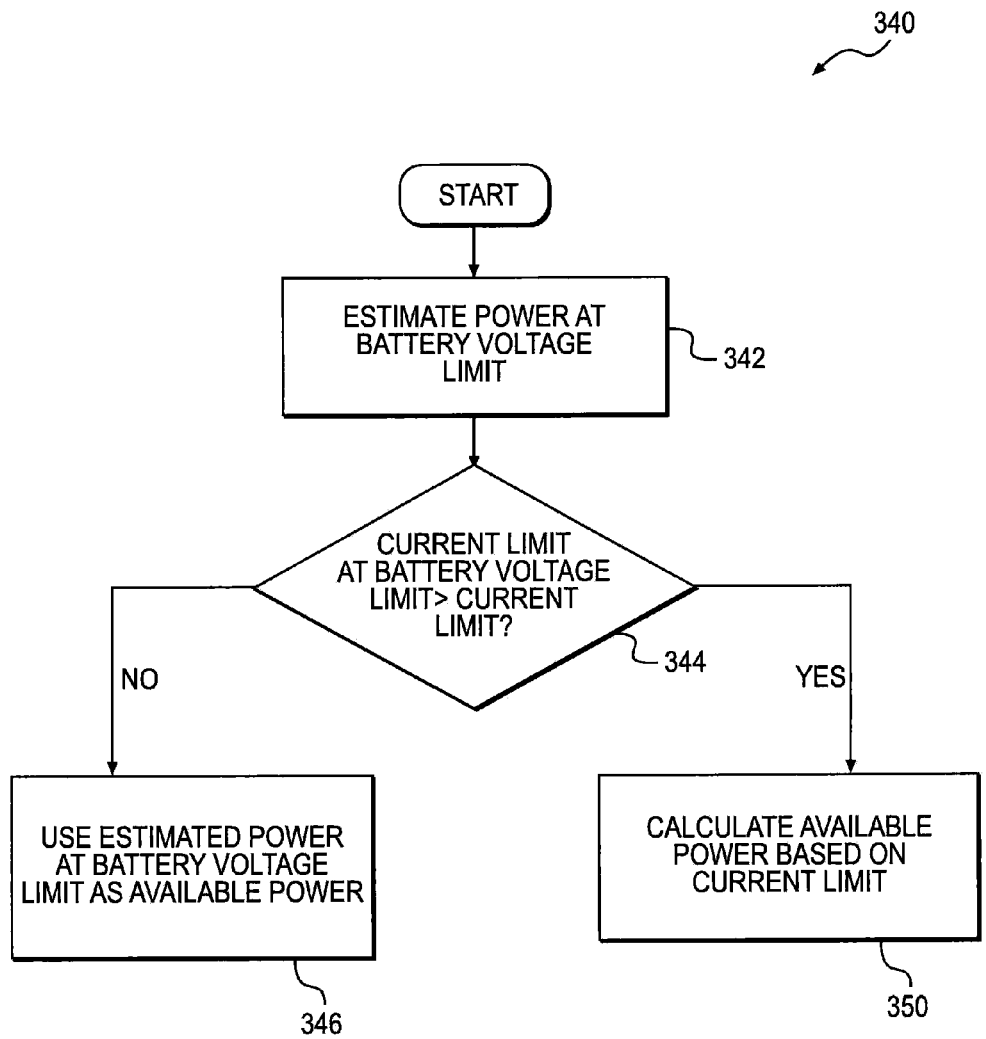
FIG. 3C illustrates a flow chart that outlines a portion of the flow chart of FIG. 3B in greater detail.
Figure 3D:
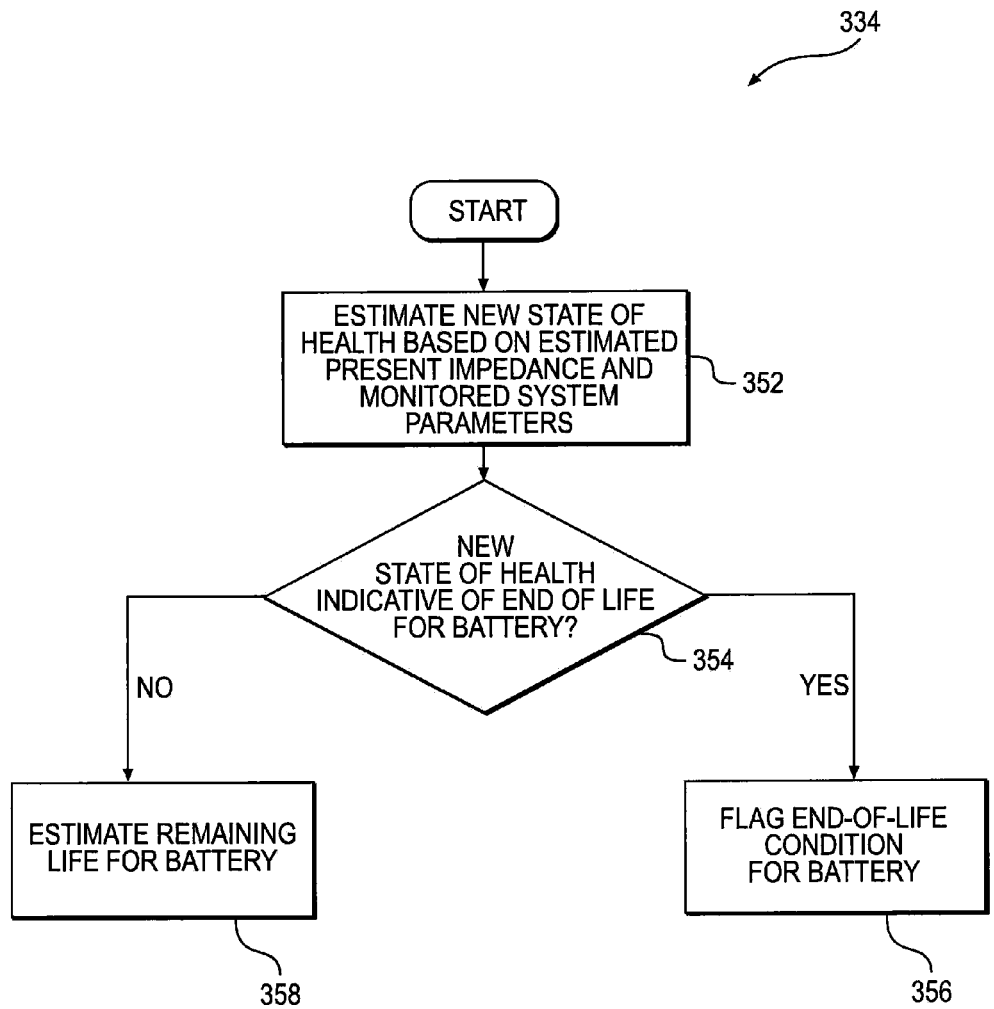
FIG. 3D illustrates a flow chart that outlines a portion of the flow chart of FIG. 3B in greater detail.

An exemplary embodiment of how power-system controls 26 may implement battery monitoring (step 312) is shown in more detail in FIG. 3B. One part of this process may be monitoring sensed parameters related to battery 48 (step 320). This may involve, for example, monitoring the sensed terminal voltage of battery 48, monitoring the magnitude and direction of electric current flowing to or from battery 48, and monitoring the temperature of battery 48. It may also involve monitoring various other system parameters related to battery 48. With these monitored parameters, power-system controls 26 may estimate the state of charge of battery (step 322), as well as the open-circuit voltage of battery 48 (step 326). Power-system controls 26 may estimate the value of these parameters using the approaches discussed above in connection with SOC block 216 shown in FIG. 2.

While operating the power loads of machine 10 and controlling charging and discharging of battery 48, power-system controls 26 may also perform processes for evaluating the state of health of battery 48 by performing accurate measurement of the internal impedance of battery 48. These processes may be performed, for example, by SOH block 218 of the control architecture shown in FIG. 2. As part of these processes, while controlling charging and discharging of battery 48 based on the power needs of the electrical power loads of power system 11, power-system controls 26 may monitor for the occurrence of circumstances conducive to performing an accurate measurement of the internal resistance of battery 48. Such circumstances may include a situation where the terminal voltage of battery 48 is substantially equal to its open-circuit voltage, such that power-system controls 26 can accurately know the open-circuit voltage by measuring the terminal voltage with voltage sensor 144. The terminal voltage may substantially equal the open-circuit voltage when battery 48 has been relaxed for some period of time, i.e., when battery 48 has received and/or discharged relatively little electricity for some period of time. Accordingly, power-system controls 26 may monitor for circumstances when the control of charging and discharging based on the power needs of the electrical power loads of power system 11 have resulted in a period of limited or no charging and/or discharging of battery 48 for a while. This may occur, for example, when machine 10 and power system 11 are running but the operator has not activated the power loads for some period of time, such as during a lunch break or the like.

In some embodiments, this monitoring process may include checking to see if battery 48 has been relaxed for a period of time greater than or equal to a reference period P1 (step 328). To determine whether battery 48 has been in a relaxed state for a time greater than or equal to period P1, power-system controls 26 may determine whether the magnitude of electric current flowing to and/or from battery 48 has remained smaller than some reference value for the reference period P1. The reference value for the magnitude of electric current and the reference period P1 may be of such a magnitude that when they are satisfied, the terminal voltage of battery 48 should serve as a relatively accurate measure of its open-circuit voltage. If power-system controls 26 determine that battery 48 has been relaxed for at least the reference period P1 (step 328), power-system controls 26 may record the present terminal voltage of battery 48 as the open-circuit voltage (step 319).

Subsequently, power-system controls 26 may monitor for circumstances where the charging and discharging of battery 48 based on the power needs of the power loads creates a significant rise in battery current. This may occur, for example, when the power needs of the electrical power loads increase after a significant relaxation period of battery 48, such as if an operator leaves the power loads inactive for a while and then resumes using them. To monitor for such circumstances, power-system controls 26 may evaluate whether the magnitude of electric current flowing to or from battery 48 has increased to a magnitude greater than a reference value I1 (step 330). Reference value I1 may be a relatively large current magnitude that would cause the terminal voltage to differ significantly from the open-circuit voltage. For example, in some embodiments, reference value I1 may be a value equal to or greater than 1 C (1 C being the magnitude of current required to discharge battery 48 from fully charged to fully discharged in one hour). If power-system controls 26 determine that battery current has increased to a magnitude greater than the reference value I1, power-system controls 26 may record the magnitude of the current and the terminal voltage existing at this time (step 331).

Subsequently, power-system controls 26 may estimate the present internal impedance of battery 48 based on the recorded terminal voltages and the recorded electric current value (step 332). Power-system controls 26 may use one of equations 1 and 2 set forth below to do so. Power-system controls 26 may use equation 1 in circumstances where a large discharging current follows the relaxation period, and power-system controls may use equation 2 where a large charging current follows the relaxation period. In equations 1 and 2, $R_D$ is the internal impedance for discharging situations, $R_C$ is the internal impedance for charging situations, OCV is the open-circuit voltage, $V_{Dch}$ is the terminal voltage when battery 48 is discharging, $I_{Dch}$ is the magnitude of the discharging current, $V_{Chg}$ is the terminal voltage when battery 48 is charging, and $I_{Chg}$ is the magnitude of the charging current.

$$R_D = \frac{(OCV - V_{Dch})}{I_{Dch}} \quad \text{EQ 1}$$

$$R_C = \frac{(V_{Chg} - OCV)}{I_{Chg}} \quad \text{EQ 2}$$

Using this approach, power-system controls 26 may generate a very accurate estimate of the internal impedance of battery 48 in those circumstances where battery 48 experiences a significant relaxation period during operation of power system 11. As discussed in greater detail below, this may allow power-system controls 26 to accurately evaluate the state of health of battery 48 using the estimated impedance value (step 334).

In some applications and/or circumstances, the default charging and discharging control strategy for battery 48 may result in very long periods of time between periods when battery 48 experiences significant relaxation. This may delay reevaluating the state of health of battery 48. Some embodiments of power-system controls 26 may have provisions for working around these difficulties to periodically obtain an accurate measure of the internal impedance of battery 48 and reevaluate the state of health of battery 48.

For example, in the embodiment shown in FIG. 3B, when power-system controls 26 determine that battery 48 has not experienced a significant relaxation period (step 328), power-system controls 26 may determine whether the elapsed time since the last evaluation of the state of health of battery 48 exceeds a reference period P2 (step 336). If power-system controls 26 determine that it has been longer than reference period P2 since the last state of health evaluation, power-system controls 26 may take steps to measure the internal impedance based on sample terminal voltages (step 332), regardless of whether the default charging/discharging algorithm has afforded a relaxation period. Power-system controls 26 may use various approaches to do so. For example, at the next power system startup, power-system controls 26 may measure the terminal voltage of battery 48 and record it as a measured value of the open-circuit voltage before commencing charging or discharging of battery 48. Additionally or alternatively, power-system controls 26 may force a relaxation period of battery 48 during operation, so that they may measure the open-circuit voltage. During such a forced relaxation period, power-system controls 26 may, for example, provide electricity to drive the power loads exclusively from electric motor/generator 32.

Each time power-system controls 26 use the foregoing approach to evaluate the internal impedance of battery 48, they may subsequently use the resulting impedance value to evaluate the state of health of battery 48 (step 332). This process may be performed by SOH block 218 shown in FIG. 2. Power-system controls 26 may use various approaches to assess the state of health of battery 48 based on the internal impedance. FIG. 3D illustrates one method that power-system controls 26 may use. In this exemplary approach, power-system controls 26 may first estimate a state of health value for battery 48 based on the measured impedance and other monitored system parameters (step 352). Power-system controls 26 may do so, for example, by using one or more tables and/or equations that define relationships between the state of health value and the battery temperature, state of charge, terminal voltage, and current magnitude. When doing so, power-system controls 26 may also account for whether the internal impedance was measured in connection with discharging or charging of battery 48, i.e., whether $R_D$ or $R_C$ was determined.

After estimating the state of health of battery 48, power-system controls 26 may determine whether the estimated state of health indicates that battery 48 has reached the end of its useful life (step 354). If the state of health value indicates the battery has reached the end of its useful, power-system controls 26 may flag an end-of-life condition for battery 48 (step 356). For example, power-system controls 26 may record a code and/or generate an alert that battery 48 has reached the end of its useful life. If the estimated state of health value does not indicate that battery 48 has reached the end of its useful life, power-system controls 26 may estimate how much life battery 48 has remaining (step 358).

Using the foregoing approach, power-system controls 26 may accurately reevaluate the state of health of battery 48 each time they identify a situation where the terminal voltage is an accurate indication of the open-circuit voltage. Periodically updating the state of health of battery 48 in this manner may allow power-system controls 26 to account for the effects of battery degradation in various control processes, such as the processes of estimating how much electric current, electric power, and/or energy battery 48 can receive and/or discharge at any given time.

Between those times when the opportunity arises to use the terminal voltage as an accurate measure of open-circuit voltage to reassess the state of health of battery 48, power-system controls 26 may use the most recently estimated state of health value to perform various calculations related to the present capabilities of battery 48. This is illustrated in FIG. 3B. For example, when power-system controls 26 determine that battery 48 is not in a relaxation period (step 328) and the elapsed time since the last evaluation of the state of health does not exceed the reference period P2 (step 336), power-system controls 26 may proceed to estimate the impedance of battery 48 based on the most recent state of health value and one or more other parameters (step 338). In addition to the most recently estimated state of health, power-system controls 26 may base this estimation of the impedance on factors such as the terminal voltage, the electric current magnitude, the electric current direction (i.e., whether battery 48 is being discharged or charged), the battery temperature, and the state of charge. Power-system controls 26 may do so, for example, using one or more tables and/or equations that define relationships between internal impedance of battery 48, the state of health, and the other parameters. While the estimated state of health of battery 48 may allow power-system controls 26 to account for the effects of battery degradation, the other factors may allow power-system controls 26 to account for changes in other operating parameters that affect the internal impedance. Power-system controls 26 may account for changes in battery temperature, voltage, and current by continually measuring these parameters and using them in combination with the most recent state-of-health estimate to continually update the estimated internal impedance of battery 48.

With the internal impedance estimate, power-system controls 26 may estimate how much electrical charging or discharging power can be supplied to or drawn from battery 48 (step 340). For example, power-system controls 26 may use the process shown in FIG. 3C to do so. As part of this process, power-system controls 26 may first use the estimated internal impedance to determine power limits based on terminal voltage limitations for battery 48 (step 342). To do so, power-system controls 26 may first determine magnitudes of discharging and charging current that battery 48 can receive without driving terminal voltage outside certain limits. Equation 3 may be used to determine a magnitude of discharging current, $DI_{BVL}$, that battery 48 can experience without driving terminal voltage below a lower limit, $V_{min}$. Equation 4 may be used to determine a magnitude of charging current, $CI_{BVL}$, that battery 48 can experience without driving terminal voltage above an upper limit, $V_{max}$. In equations 3 and 4, OCV is the open-circuit voltage of battery 48, $R_D$ is the estimated internal impedance of battery 48 for discharging, and $R_C$ is the estimated internal impedance of battery 48 for charging.

$$DI_{BVL}=(OCV-V_{min})/R_D \quad \text{EQ3:}$$

$$CI_{BVL}=(V_{max}-OCV)/R_C \quad \text{EQ4:}$$

Once the current magnitudes $DI_{BVL}$, $CI_{BVL}$, based on terminal voltage limits $V_{min}$, $V_{max}$ are determined, power-system controls 26 may use equations 5 and 6 below to determine how much power battery 48 can supply at these magnitudes of current. Equation 5 may be used to determine a magnitude of discharging power, $DP_{BVL}$, that battery 48 can provide. Equation 6 may be used to determine a magnitude of charging power, $CP_{BVL}$, that battery 48 can receive.

$$DP_{BVL}=DI_{BVL}*V_{min} \quad \text{EQ5:}$$

$$CP_{BVL}=CI_{BVL}*V_{max} \quad \text{EQ6:}$$

After using equations 3 and 4 to calculate the magnitudes of electric charging and discharging current that can be applied to battery 48 without exceeding the terminal voltage limits of battery 48, power-system controls 26 may also determine whether these values exceed limits for electric current magnitude (step 344). The limits for electric current magnitude may be limits on how much current one or more components of power system 11 can handle. These limits may, for example, be limits for the magnitude of current battery 48 can handle and/or limits for the magnitude of current other components that are connected to battery 48 can handle. Power-system controls 26 may use the inequalities listed below to determine whether the discharging and/or charging current at the battery voltage limits exceed the limits for electric current magnitude. In these inequalities, DILimit is a limit for discharging current, and CILimit is a limit for charging current.

$$DI_{BVL}>DI\text{Limit}$$

$$CI_{BVL}>CI\text{Limit}$$

If power-system controls 26 determine that both of these inequalities are false, power-system controls 26 may use the values $DI_{BVL}$, $DP_{BVL}$, $CI_{BVL}$, and $CP_{BVL}$ associated with the voltage limits of battery 48 as the limits for charging and discharging current and power (step 346). On the other hand, if power-system controls 26 determine that the above inequalities are true, power-system controls 26 may take additional steps to calculate the available power based on the current limits DILimit and CILimit (step 350). To do so, power-system controls 26 may first calculate what terminal voltage battery 48 would have at the discharging and charging current limits DILimit, CILimit, respectively. For example, power-system controls 26 may use equation 7 to calculate a terminal voltage $V_{DCI}$ that battery 48 would have at the discharging current limit DILimit. Similarly, power-system controls 26 may use equation 8 to calculate a terminal voltage $V_{CGI}$ that battery 48 may have at the charging current limit CILimit. In equations 7 and 8, $R_D$ is the estimated internal impedance for discharging, and $R_C$ is the estimated internal impedance for charging.

$$V_{DCI}=OCV-(R_D*DI\text{Limit}) \quad \text{EQ7:}$$

$$V_{CGI}=OCV+(R_C*CI\text{Limit}) \quad \text{EQ8:}$$

After calculating the terminal voltages $V_{DCI}$, $V_{CGI}$ that battery 48 would have at the discharging and charging current limits, DILimit, CILimit, power-system controls 26 may calculate how much power battery 48 can discharge or receive at the current limits DILimit, CILimit. For example, equation 9 may be used to calculate how much discharging power $DP_I$ battery 48 could provide at the discharging current limit DILimit and the associated terminal voltage $V_{DCI}$. Similarly, equation 10 could be used to calculate how much charging power $CP_I$ battery 48 could receive at the charging current limit CILimit and the associated terminal voltage $V_{CGI}$. Equations 9 and 10 resemble equations 5 and 6 with different power, current, and voltage variables.

$$DP_I=DI\text{Limit}*V_{DCI} \quad \text{EQ9:}$$

$$CP_I=CI\text{Limit}*V_{CGI} \quad \text{EQ10:}$$

Power-system controls 26 may use various systems of variables and equations other than those discussed above in the calculation of the various values associated with the operation of battery 48. The above examples use one set of variables and equations for calculating limits based on the terminal voltage limits of battery 48 and another set of variables and equations for calculating limits based on current limits. However, some embodiments of power-system controls 26 may use the same equations and variables for calculating limits based on terminal-voltage limits and for calculating limits based on current magnitude limits. In some embodiments, power-system controls 26 may do so, for example, by changing the value of one or more of variables in memory between the various calculations. For instance, instead of using $V_{max}$, $V_{min}$, $V_{DCI}$, and $V_{CGI}$, power-system controls 26 may simply use $V_{max}$ and $V_{min}$, and power-system controls 26 may simply change the value of $V_{max}$ and $V_{min}$ in memory between calculating limits based on terminal voltage limits and calculating limits based on current magnitude limits. Similarly, in lieu of using $DP_{BVL}$, $CP_{BVL}$, $DP_I$, and $CP_I$, power-system controls 26 may use one pair of variables for charging and discharging power. In such an embodiment, power-system controls 26 could simply recalculate and replace the values of available power as necessary based on whether $DI_{BVL}$ and $DP_{BVL}$ or DILimit and CILimit present more restrictive limits on current magnitude. Alternatively, power-system controls 26 could wait until after determining which of the calculated current magnitudes present more restrictive limits before calculating available power.

Returning to FIG. 3B, in addition to calculating limits for the magnitude of current and power that can be discharged from and/or supplied to battery 48, power-system controls 26 may estimate how much energy battery 48 can discharge and/or supply (step 324). Power-system controls 26 may do so, for example, based on the estimated state of charge and the estimated state of health of battery 48.

Methods of monitoring battery 48 and controlling power system 11 are not limited to the examples discussed above and shown in the drawings. Power-system controls 26 may use different equations and/or parameters to estimate various aspects of the operating state of battery 48. Additionally, power-system controls 26 may perform the processes discussed above in different orders. Similarly, power-system controls 26 may omit one or more of the discussed processes and/or execute processes in addition to those discussed above.

The disclosed embodiments may provide certain advantages. For example, by identifying circumstances where charging and discharging of battery based on the power needs of the power loads results in a relaxed state of the battery and capitalizing on those circumstances to capture an accurate, measured value of the open-circuit voltage, the disclosed methods may substantially or completely avoid a need to modify the charging and discharging strategy to artificially relax battery 48 to glean its open-circuit voltage. Similarly, by identifying subsequent circumstances where the power needs of the power loads trigger an increase in battery current, the disclosed methods may substantially or completely avoid a need to introduce an artificial battery current for purposes of assessing an internal resistance and state of health of battery 48. These aspects of the disclosed methods may help power-system controls 26 maintain an accurate, updated estimate of the state of health of battery 48 without substantially impeding an operator's use of power system 11. In turn, this may allow power-system controls 26 to accurately account for the effects of battery degradation in estimating the capabilities of the battery 48 during operation.

Additionally, the approach of comparing electric current limits of battery 48 to the general electric current limits of power system 11 (as discussed in connection with FIG. 3C) may also provide certain advantages. Specifically, this may help power-system controls 26 manage charging and discharging of battery 48 in a manner that will meet the needs of battery 48 and prevent damage to other components of power system 11 due to overcurrent.

It will be apparent to those skilled in the art that various modifications and variations can be made in the disclosed system and methods without departing from the scope of the disclosure. Other embodiments of the disclosed system and methods will be apparent to those skilled in the art from consideration of the specification and practice of the system and methods disclosed herein. It is intended that the specification and examples be considered as exemplary only, with a true scope of the disclosure being indicated by the following claims and their equivalents.

What is claimed is:

1. A method for real-time characterization of a battery in a power system, the method comprising:
    between startup and shutdown of the power system, operating the power system by:
    providing electric power to one or more electrical power loads of the power system,
    charging and discharging the battery based on power needs of the one or more electrical power loads,
    with at least one information-processing device, monitoring for a circumstance where the charging and discharging of the battery based on the power needs of the one or more electrical power loads results in a measured terminal voltage of the battery substantially equaling an open-circuit voltage of the battery and recording the measured terminal voltage as a first measured voltage,
    with the at least one information-processing device, monitoring for a circumstance subsequent to the measured terminal voltage substantially equaling the open-circuit voltage when charging and discharging the battery based on the power needs of the electrical power loads results in a battery current larger than a predetermined value and recording an existing terminal voltage as a second measured voltage, and
    with the at least one information-processing device, using the battery current larger than a predetermined value, the first measured voltage and the second measured voltage to determine an internal impedance of the battery, wherein the internal impedance of the battery is equal to the difference between the first measured voltage and the second measured voltage divided by the battery current larger than a predetermined value.

2. The method of claim 1, wherein monitoring for a circumstance where the charging and discharging of the battery based on the power needs of the one or more electrical power loads results in a measured terminal voltage of the battery substantially equaling an open-circuit voltage of the battery and recording the measured terminal voltage as the first measured voltage includes:
    with the at least one information-processing device, monitoring for a circumstance where battery current has remained smaller than a reference value for a reference period; and
    when battery current has remained smaller than the reference value for the reference period, recording with the at least one information-processing device the measured terminal voltage of the battery as the first measured voltage.

3. The method of claim 2, further comprising using the internal impedance of the battery to estimate with the at least one information-processing device a value indicative of a state of health of the battery.

4. The method of claim 3, further comprising, subsequent to estimating the value indicative of the state of health of the battery, repeatedly reestimating with the at least one information-processing device the internal impedance of the battery based on the estimated value indicative of the state of health of the battery and at least one of a measured temperature of the battery, a measured terminal voltage of the battery, or a measured battery current magnitude.

5. The method of claim 4, further comprising determining with the at least one information-processing device a limit for a magnitude of battery current based on voltage limits for the battery and the estimated internal impedance.

6. The method of claim 1, further comprising using the internal impedance of the battery to estimate with the at least one information-processing device a value indicative of a state of health of the battery.

7. The method of claim 6, further comprising, subsequent to estimating the value indicative of the state of health of the battery, repeatedly reestimating with the at least one information-processing device the internal impedance of the battery based on the estimated value indicative of the state of health of the battery and at least one of a measured temperature of the battery, a measured terminal voltage of the battery, or a measured battery current magnitude.

8. The method of claim 7, further comprising determining with the at least one information-processing device a limit for a magnitude of battery current based on voltage limits for the battery and the estimated internal impedance.

9. The method of claim 6, further comprising using the value indicative of the state of health of the battery to determine with the at least one information-processing device whether the battery has reached an end of its useful life.

10. The method of claim 6, further comprising using the value indicative of the state of health of the battery to estimate with the at least one information-processing device how much remaining life the battery has.

* * * * *